US012702076B2

(12) United States Patent
Guo et al.

(10) Patent No.: US 12,702,076 B2
(45) Date of Patent: Aug. 4, 2026

(54) DISPLAY MODULE ASSEMBLY MEMBER, DISPLAY MODULE AND SPLICING DISPLAY APPARATUS

(71) Applicants: BOE MLED Technology Co., Ltd., Beijing (CN); BOE TECHNOLOGY GROUP CO., LTD., Beijing (CN)

(72) Inventors: Shaofei Guo, Beijing (CN); Shipeng Wang, Beijing (CN); Chao Tian, Beijing (CN); Zhonghua Li, Beijing (CN); Dongjia Hao, Beijing (CN); Yiping Ruan, Beijing (CN)

(73) Assignees: BOE MLED Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/577,222

(22) PCT Filed: Aug. 30, 2022

(86) PCT No.: PCT/CN2022/115768
§ 371 (c)(1),
(2) Date: Jan. 5, 2024

(87) PCT Pub. No.: WO2024/044945
PCT Pub. Date: Mar. 7, 2024

(65) Prior Publication Data
US 2025/0192114 A1     Jun. 12, 2025

(51) Int. Cl.
*H10W 90/00*     (2026.01)

(52) U.S. Cl.
CPC .................................. *H10W 90/00* (2026.01)

(58) Field of Classification Search
CPC .. G09F 9/30; G09F 9/33; H10W 90/00; H10P 72/7618; H10P 72/7624; H10P 72/00
See application file for complete search history.

(56) References Cited

U.S. PATENT DOCUMENTS

| | | | | |
|---|---|---|---|---|
| 12,336,387 | B2 * | 6/2025 | Wang | H10K 59/1213 |
| 12,414,247 | B2 * | 9/2025 | Guo | H05K 5/0217 |
| 2007/0051617 | A1 * | 3/2007 | White | H01J 37/3408 204/192.1 |
| 2017/0092530 | A1 * | 3/2017 | Kaba | H10P 72/7624 |

(Continued)

FOREIGN PATENT DOCUMENTS

CN          111415581 A  *  7/2020  ............... H05K 7/14

*Primary Examiner* — Douglas W Owens
(74) *Attorney, Agent, or Firm* — HOUTTEMAN LAW LLC

(57)          ABSTRACT

The present disclosure provides an assembly member of a display module, the assembly member is configured to be assembled with a case, the case includes a first magnetic member. The assembly member includes: a bearing structure configured to bear at least one display substrate; and a fixing assembly disposed on the bearing structure and configured to be movable relative to the bearing structure. The fixing assembly includes: a second magnetic member and a fixed part fixedly connected to the second magnetic member, where the fixed part is located on a side of the second magnetic member close to the first magnetic member, and configured to be magnetically attracted with the first magnetic member. The present disclosure further provides a display module and a splicing display apparatus.

19 Claims, 11 Drawing Sheets

(56)                    References Cited

U.S. PATENT DOCUMENTS

| | | | |
|---|---|---|---|
| 2018/0277417 A1* | 9/2018 | Ishii | H10P 72/0406 |
| 2021/0105902 A1* | 4/2021 | Yoon | H01F 7/02 |
| 2023/0131298 A1* | 4/2023 | Wang | G09F 9/335 |
| | | | 248/183.2 |
| 2023/0176411 A1* | 6/2023 | Fan | G02F 1/13336 |
| | | | 349/56 |
| 2026/0061431 A1* | 3/2026 | Byun | B03C 1/18 |

* cited by examiner

21v

21b

231

232    } 23

233

30

40

21

12a

10 { 12
     11

S

S
N

23

22

50 { 52
     53

51

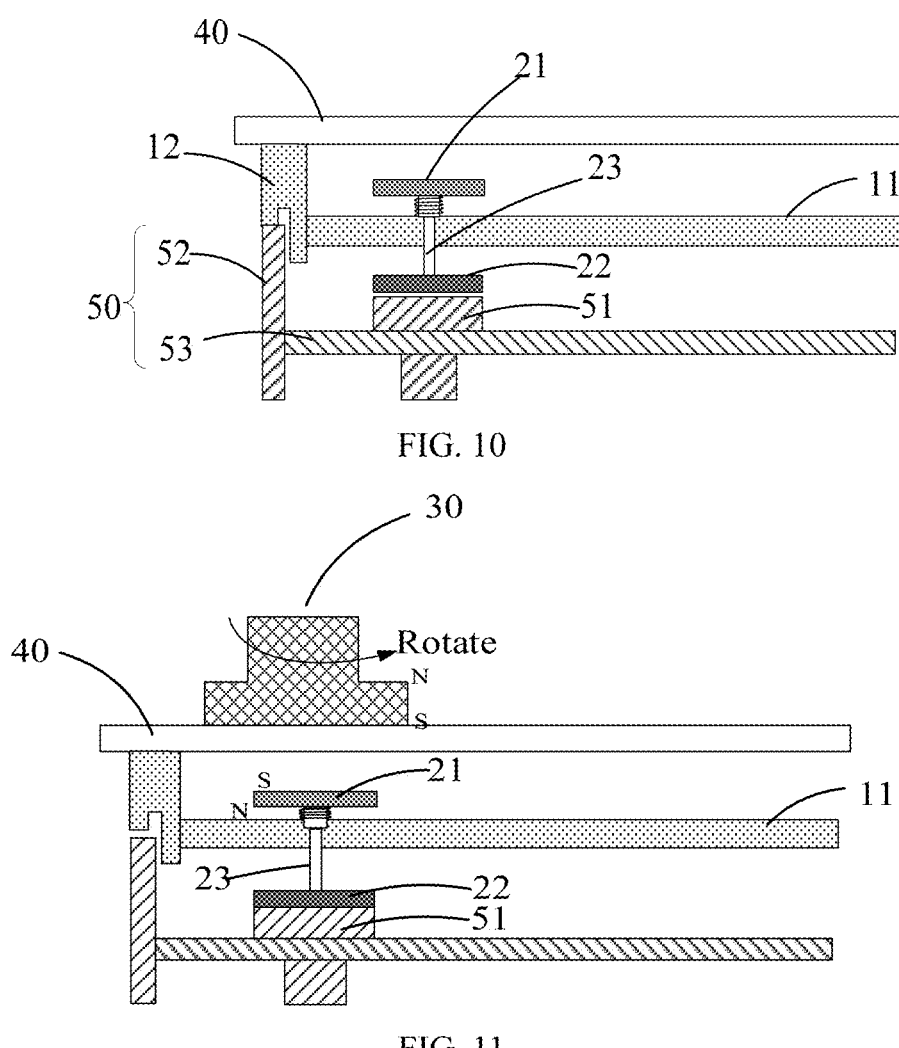
FIG. 10
FIG. 11
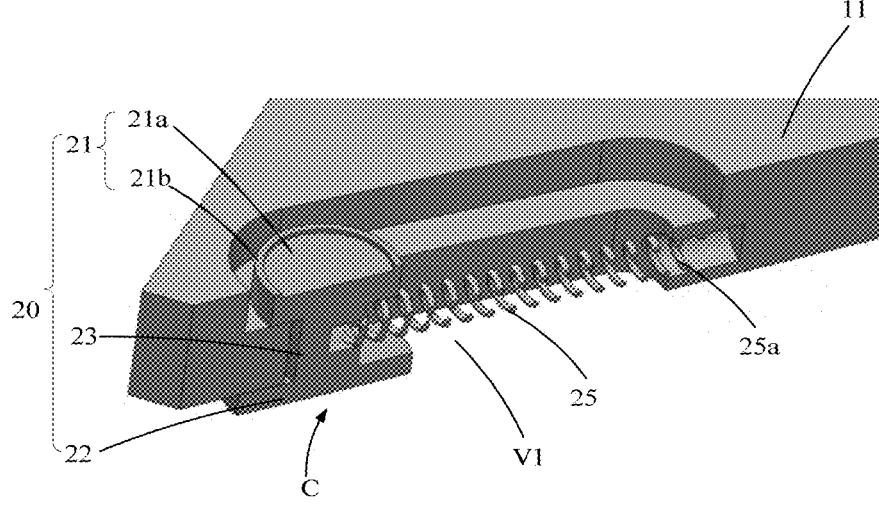
FIG. 12

DISPLAY MODULE ASSEMBLY MEMBER, DISPLAY MODULE AND SPLICING DISPLAY APPARATUS

TECHNICAL FIELD

The present disclosure relates to the field of display technology, and specifically relates to a display module assembly member, a display module, and a splicing display apparatus.

BACKGROUND

A micro inorganic light-emitting diode typically includes a MiniLED and a MicroLED. The MiniLED refers to a light-emitting diode (LED) chip with a grain size of about 100 to 300 microns. The MicroLED refers to an LED chip with a grain size of less than 100 microns. The MiniLED/MicroLED display device has the advantages of low power consumption, high brightness, high resolution, high color saturation, fast response, long service life, high efficiency and the like. In addition, a plurality of MiniLED/MicroLED display devices may be seamlessly spliced to obtain an oversized display product, which has promising application prospects in large-size display fields of command and monitoring centers, business centers, high-end conferences, cinemas and the like.

SUMMARY

The present disclosure proposes a display module assembly member, a display module, and a splicing display apparatus.

The present disclosure provides an assembly member of a display module, the assembly member is configured to be assembled with a case, the case includes a first magnetic member, wherein the assembly member includes:

a bearing structure configured to bear at least one display substrate; and a fixing assembly disposed on the bearing structure and configured to be movable relative to the bearing structure; and the fixing assembly includes: a second magnetic member and a fixed part fixedly connected to the second magnetic member, wherein the fixed part is located on a side of the second magnetic member close to the first magnetic member, and the fixed part is configured to be magnetically attracted with the first magnetic member.

In some embodiments, the bearing structure includes a bottom plate and a side wall, wherein the side wall includes a top surface and a side surface connected with each other, the top surface is configured to bear the display substrate, and the side surface is connected to the bottom plate, a mounting hole is provided in the bottom plate; and the fixing assembly further includes: a connection member with two ends connected to the second magnetic member and the fixed part, respectively, wherein the connection member passes through the mounting hole, and the connection member is configured to be movable in a direction parallel or perpendicular to the bottom plate.

In some embodiments, the connection member includes: a first rod part and a second rod part connected with each other, the second magnetic member is connected to the first rod part, the first rod part is provided with external threads, and the mounting hole is provided with internal threads matched with the external threads.

In some embodiments, the assembly member further includes: a first elastic member having one end abutted against the second magnetic member, and the other end relatively fixed to the bottom plate; and wherein a length of the first elastic member in a compression limit state is smaller than a length of the first rod part.

In some embodiments, the first elastic member includes a compression spring wound around the connection member.

In some embodiments, the mounting hole includes a first mounting sub-hole and a second mounting sub-hole coaxially arranged and communicated with each other, the first mounting sub-hole is located on a side of the second mounting sub-hole away from the fixed part, the internal threads are provided in the first mounting sub-hole, and an inner surface of the second mounting sub-hole and a surface of the second rod part are smooth surfaces.

In some embodiments, the first mounting sub-hole has a larger bore diameter than the second mounting sub-hole, and the first rod part has a larger diameter than the second rod part.

In some embodiments, the first mounting sub-hole has a bore diameter between 1.8 mm and 3.2 mm, and the second mounting sub-hole has a bore diameter between 1 mm and 2.4 mm.

In some embodiments, the second magnetic member includes a mount and a magnetic block, the magnetic block is fixed on the mount, and the mount is connected to the connection member.

In some embodiments, the second magnetic member includes one magnetic block through which an extension line of an axis of the connection member passes.

In some embodiments, the second magnetic member includes a plurality of magnetic blocks uniformly distributed around an extension line of an axis of the connection member.

In some embodiments, the mounting hole is a strip-shaped hole, and the connection member is configured to be slidable along a length direction of the mounting hole.

In some embodiments, the strip-shaped hole is provided with a second elastic member having one end connected to the bottom plate and the other end connected to the connection member, and the second elastic member is configured to be stretchable along a length direction of the strip-shaped hole.

In some embodiments, the mounting hole includes: a first guide sub-hole and a second guide sub-hole communicated with each other, at least part of the second magnetic member is located in the first guide sub-hole, and at least part of the connection member is located in the second guide sub-hole.

In some embodiments, the fixed part includes an iron block.

In some embodiments, the fixed part is threadedly connected to the connection member.

In some embodiments, the fixing assembly is provided at least at a corner position of the bearing structure.

An embodiment of the present disclosure further provides a display module, including: a display substrate, a case, and the assembly member as described above, wherein a bearing structure in the assembly member is configured to bear the display substrate; and the case includes a first magnetic member magnetically attracted with a fixed part of the fixing assembly.

An embodiment of the present disclosure further provides a splicing display apparatus, including the display module as described above, wherein the splicing display apparatus includes a plurality of display substrates spliced with each other.

BRIEF DESCRIPTION OF DRAWINGS

Accompanying drawings are provided for further understanding of the present disclosure and constitute a part of the specification. Hereinafter, these drawings are intended to explain the present disclosure together with the following specific implementations, but should not be considered as a limitation of the present disclosure. In the drawings:

FIG. 8 is a schematic view of a connection member and a mount in the fixing assembly of FIG. 7.

FIGS. 9 to 11 are schematic views illustrating an assembly process of an assembly member according to some embodiments of the present disclosure with a case.

FIG. 12 is a partial cutaway view of an assembly member according to further embodiments of the present disclosure.

DETAIL DESCRIPTION OF EMBODIMENTS

Figure 1:
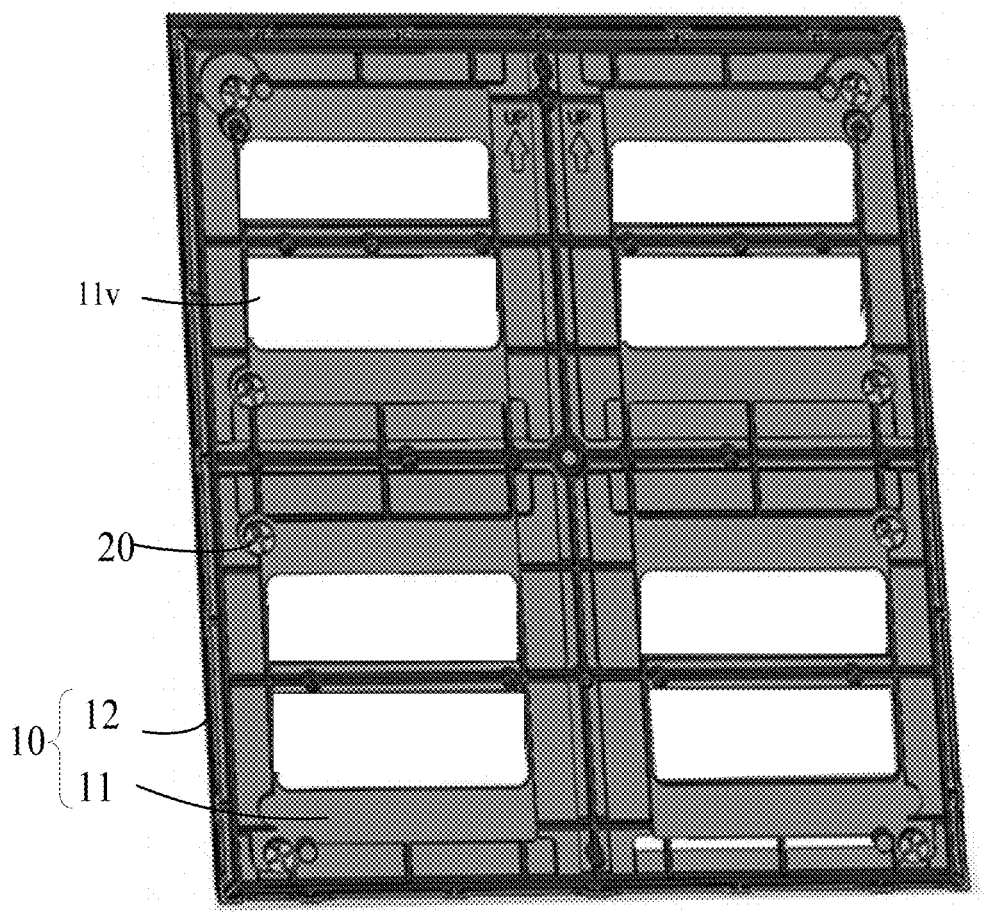
FIG. 1 is an overall schematic view of an assembly member of a display module according to some embodiments of the present disclosure.

Hereinafter, specific implementations of the present disclosure will be described with respect to the accompanying drawings. It will be appreciated that the specific implementations as set forth herein are merely for the purpose of illustration and explanation of the present disclosure and should not be constructed as a limitation thereof.

To make the objects, technical solutions and advantages of the embodiments of the present disclosure more apparent, the technical solutions according to the embodiments of the present disclosure will be clearly and completely described below with reference to the drawings of the embodiments of the present disclosure. Apparently, the described embodiments are some, but not all, of the embodiments of the present disclosure. All other embodiments obtained by those of ordinary skill in the art based on the embodiments of the present disclosure described herein without paying any creative effort shall be included in the protection scope of the present disclosure.

The terminology used herein to describe embodiments of the disclosure is not intended to limit and/or define the scope of the present disclosure. For example, unless otherwise defined, technical or scientific terms used in the present disclosure are intended to have general meanings as understood by those of ordinary skill in the art. It will be appreciated that the words "first", "second" and similar terms used in the present disclosure do not denote any order, quantity, or importance, but are used merely for distinguishing different components from each other. The singular forms "a," "an," or "the" and similar referents do not denote a limitation of quantity, but rather denote the presence of at least one, unless the context clearly dictates otherwise. The word "comprise" or "include", and the like, means that the element or item appearing in front of the word "comprise" or "include" includes the element or item listed after the word "comprise" or "include" and equivalents thereof, and does not exclude other elements or items. The terms "connected" or "coupled" and the like are not restricted to physical or mechanical connections, but may include electrical connections, whether direct or indirect. The words "upper", "lower", "left", "right", or the like are merely used to indicate a relative positional relationship, and when an absolute position of the described object is changed, the relative positional relationship may also be changed accordingly.

In a splicing display apparatus, an assembly member is mounted onto a case to bear a display substrate fixed on a side of the assembly member away from the case. The display substrate includes a base substrate, and a light-emitting device on the base substrate. The light-emitting device may include a micro inorganic light-emitting diode. Further, the assembly member bears at least two display substrates spliced with each other to implement splicing display.

In the existing art, a first magnetic member is provided on the case, a second magnetic member is provided on the assembly member mounted on the case, and the first magnetic member and the second magnetic member are attracted with each other in one-to-one correspondence. The first magnetic member and the second magnetic member may be both magnetic screws. A magnetic force between the first magnetic member and the second magnetic member should ensure stable assembly of the assembly member and the case. Especially, for a display module of a larger size, since a larger size assembly member is used, there is a higher requirement on the magnetic force between the first magnetic member and the second magnetic member. In terms of such magnetic attraction, when the assembly member and the case are aligned and assembled, an instantaneous attractive force is generated between the assembly member and the case due to magnetism, leading to easy collisions of the display substrate on the assembly member. Especially, in the case of misalignment between the assembly member and the case, the display substrate is more likely to be collided, leading to a reduced yield of the product.

Figure 2:
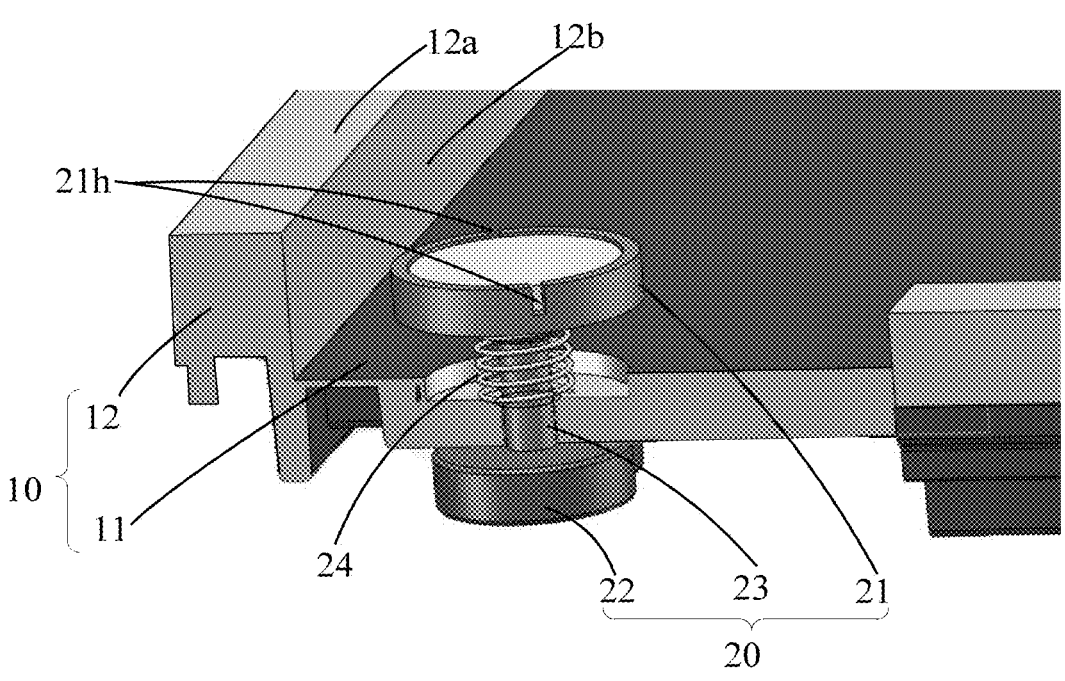
FIG. 2 is a partial schematic view of an assembly member according to some embodiments of the present disclosure.
Figure 3:
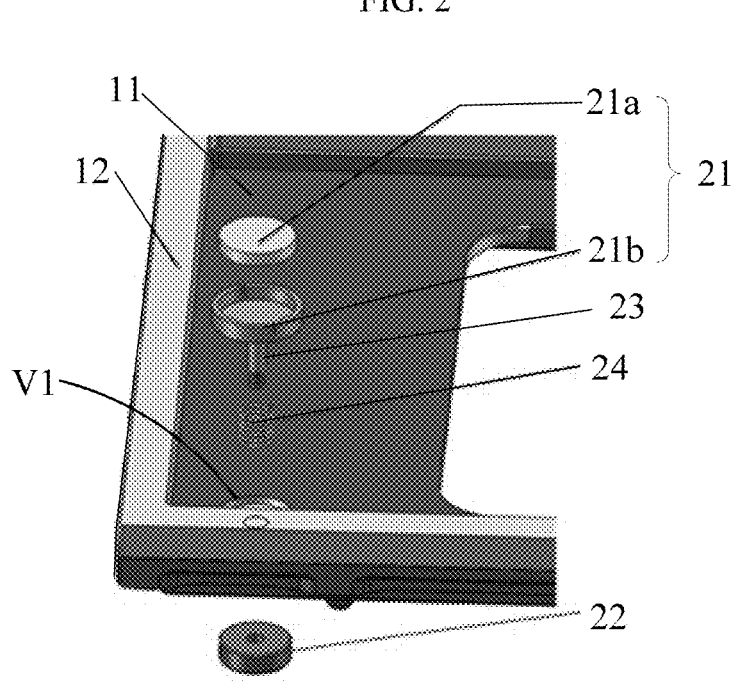
FIG. 3 is an exploded view of an assembly member according to some embodiments of the present disclosure.
Figure 4:
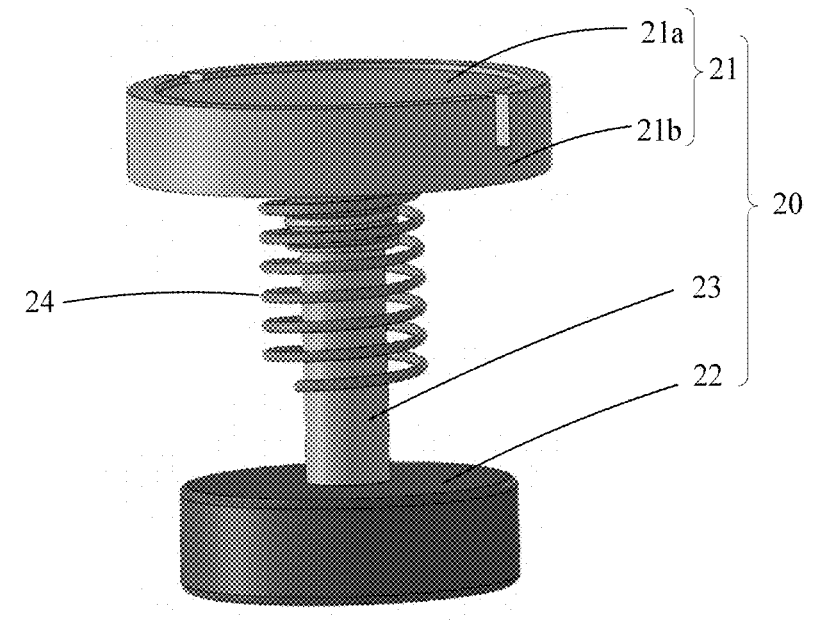
FIG. 4 is a schematic view of a fixing assembly and a first elastic member according to some embodiments of the present disclosure.

An embodiment of the present disclosure provides an assembly member of a display module, where the display module may be used in a splicing display apparatus. The display module includes a case configured to bear the assembly member. The case is provided with a first magnetic member. The first magnetic member may be threadedly connected to the case. The assembly member of the display module is configured to be assembled with the first magnetic member. FIG. 1 is an overall schematic view of an assembly member of a display module according to some embodiments of the present disclosure. FIG. 2 is a partial schematic view of an assembly member according to some embodiments of the present disclosure. FIG. 3 is an exploded view of an assembly member according to some embodiments of the present disclosure. FIG. 4 is a schematic view of a fixing assembly and a first elastic member according to some embodiments of the present disclosure. As shown in FIGS. 1 to 4, the assembly member includes: a bearing structure 10 and a fixing assembly 20.

The bearing structure 10 is configured to bear at least one display substrate. In some examples, the bearing structure 10 may bear one display substrate or bear a plurality of display substrates. When the bearing structure 10 bears a plurality of display substrates, the plurality of display substrates may be spliced with each other to implement splicing display.

The fixing assembly 20 is disposed on the bearing structure 10. The fixing assembly 20 is configured to be movable relative to the bearing structure 10. The "movable" behavior here may include: moving in a thickness direction of the display substrate, or moving in a direction parallel to a display surface of the display substrate.

The fixing assembly 20 includes: a second magnetic member 21, and a fixed part 22 fixedly connected to the second magnetic member 21. The fixed part 22 is located on a side of the second magnetic member 21 close to the first magnetic member. The fixed part 22 is configured to be magnetically attracted with the first magnetic member.

In the embodiment of the present disclosure, the fixed part 22 of the fixing assembly 20 can be magnetically attracted with the first magnetic member, and the fixing assembly 20 can be moved relative to the bearing structure 10. Therefore, when the assembly member is assembled with the case, the assembly formed by the display substrate and the assembly member can be firstly aligned with the case. During the alignment, an external magnetic device is used to attract the second magnetic member 21 to drive the fixing assembly 20 to move, so that a certain distance (referred to as a first distance) is left between the fixed part 22 and the first magnetic member, thereby reducing the magnetic force between the fixed part 22 and the first magnetic member, and preventing damage to the display module caused by a larger attractive force during alignment of the assembly member and the case. When the alignment is completed, the fixing assembly 20 is controlled to move to reduce the distance between the fixed part 22 and the first magnetic member, until the assembly member and the case are completely assembled.

The first distance may be between 3 mm and 8 mm, for example, 5 mm, so that an overall structure of the display module is prevented from being thickened while the magnetic force between the fixed part 22 and the first magnetic member is reduced.

In some embodiments, as shown in FIGS. 1 and 2, the bearing structure 10) includes: a bottom plate 11 and a side wall 12. The side wall 12 is disposed around the bottom plate 11. The side wall 12 includes a top surface 12a and a side surface 12b connected with each other. The top surface 12a is configured to bear the display substrate. The side surface 12b is connected to the bottom plate 11. In some embodiments, a hollowed-out portion 11v is provided on the bottom plate 11, and a flexible circuit board is connected to a non-display surface of the display substrate, and a signal adapter board may be provided on a side of the bottom plate 11 away from the display substrate, and the flexible circuit board may pass through the hollowed-out portion 11v, so as to connect the display substrate and the signal adapter board.

In some embodiments, the bearing structure 10 has a general box-shaped structure without a top surface. In other words, the bottom plate 11 is a plate-like structure. A fixing assembly 20 is provided at each corner position of the bearing structure 10, so as to improve stability of the assembly of the bearing structure 10 and the case. Apparently, the fixing assembly 20 may be provided at other locations of the bearing structure 10. For example, the fixing assembly 20 may be provided in an area between two adjacent corner positions.

Figure 5:
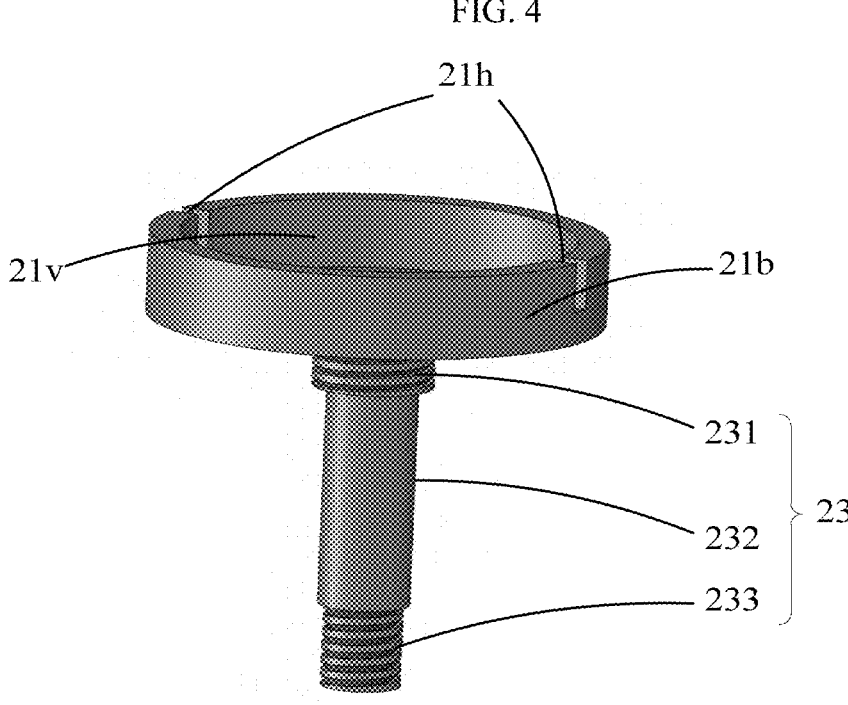
FIG. 5 is a schematic view of a connection member and a mount according to some embodiments of the present disclosure.

In some embodiments, the bottom plate 11 is provided with a mounting hole V1 penetrating through the bottom plate 11. In one example, the bottom plate 11 may be a plate-like structure with a mounting hole V1 provided at a corner position of the bottom plate 11. In addition, the mounting hole V1 may be provided at other locations of the bottom plate 11. For example, one or more mounting holes V1 may be provided in an area close to a side edge of the bottom plate 11 between two adjacent corner positions. On the same side edge of the bottom plate V1, a distance between two adjacent mounting holes V1 may be ¼ to ⅓, ⅓ to ½ or ½ to ⅚ of a length of the side edge. As shown in FIG. 3, the fixing assembly 20 passes through the mounting hole V1. As shown in FIGS. 2 to 4, in addition to the second magnetic member 21 and the fixed part 22, the fixing assembly 20 may further include a connection member 23. Two ends of the connection member 23 are connected to the second magnetic member 21 and the fixed part 22, respectively. The connection member 23 passes through the mounting hole V1 and is configured to be movable in a direction parallel or perpendicular to the bottom plate 11. FIG. 5 is a schematic view of a connection member and a mount according to some embodiments of the present disclosure. In some embodiments, as shown in FIG. 4, the second magnetic member 21 includes a magnetic block 21a and a mount 21b. The magnetic block 21a may be a permanent magnet axially magnetized. Exemplarily, a body of the magnetic block 21a may be made of a neodymium iron boron ferromagnetic material, and the magnetic block 21a may be surface treated by nickel copper nickel. The magnetic block 21a is fixed on the mount 21b, and the mount 21b is connected to the connection member 23. For example, as shown in FIG. 5, the mount 21b has a mounting recess 21v in which the magnetic block 21a is located. The mounting recess 21v may have a shape matched with the magnetic block 21a. For example, the mounting recess 21v and the magnetic block 21a each have a cylindrical or cuboid shape. Alternatively, the mounting recess 21v and the magnetic block 21a may have other shapes. The mounting recess 21v may have a depth the same as or similar to a thickness of the magnetic block 21a. The magnetic block 21a may be embedded into the mounting recess 21v, or an adhesive may be provided in the mounting recess 21v, to improve placement stability of the magnetic block 21a in the mounting recess 21v.

In the embodiments of the present disclosure, the specific connection manner of the mount 21b and the connection member 23 is not limited. For example, the mount 21b and the connection member 23 may be integrally formed. Alternatively, the mount 21b may be threadedly connected to the connection member 23.

In some embodiments, as shown in FIGS. 2 and 5, the mount 21b further has a notch 21h formed in a side wall of the mounting recess 21v. A plurality of notches 21h may be provided. For example, two notches 21h may be provided oppositely. Alternatively, three, four or more notches 21h may be provided. In one example, the mount 21b is threadedly connected to the connection member 23. In this case, when the fixing assembly 20 is assembled with the bearing structure 10, the connection member 23 may be firstly separated from the mount 21b and pass through the mounting hole V1, and then the mount 21b may be connected to the connection member 23. When the mount 21b is connected to the connection member 23, a tool may be inserted into the notch 21h to cause relative rotation between the mount 21b and the connection member 23, so that threads on the mount 21b are engaged with threads on the connection member 23. In addition, in the maintenance of the product, to take the magnetic block 21a out of the mount 21b, a chuck of a clamp may be inserted into the notch 21h to clamp and take out the magnetic block 21a.

It should be noted that in other embodiments, the mount 21b may be omitted, and the magnetic block 21a is directly and fixedly connected to the connection member 23. For example, the magnetic block 21a is threadedly connected to the connection member 23.

As shown in FIG. 5, the connection member 23 may specifically include: a first rod part 231 and a second rod part 232 connected with each other. The second magnetic member 21 is connected to the first rod part 231. That is, the mount 21b of the second magnetic member 21 is connected to the first rod part 231. The first rod part 231 is provided with external threads. The mounting hole V1 is provided with internal threads matched with the external threads. In this case, when the assembly member is initially assembled with the case, the side wall 12 of the bearing structure 10 is abutted against a side wall of the case. However, limited by precision of the manufacturing process, the display surface of the display substrate may be not parallel to a reference plane when the side wall 12 of the bearing structure 10 is abutted against the side wall of the case. For example, when the initial assembly is completed and the case is placed on a bearing surface of a bearing platform, a distance from a certain position A on the display surface of the display substrate to the bearing surface is smaller than a distance from any other position on the display surface to the bearing surface (i.e., taking the bearing surface as a reference plane, the display surface of the display substrate is not parallel to the bearing surface). In this case, the fixing assembly 20 close to the position A may be controlled to rotate so that the fixing assembly 20 descends relative to the bearing structure 10. When the fixed part 22 is abutted against the first magnetic member on the case, the fixing assembly 20 continues to be rotated, so that the fixing assembly 20 further descends relative to the bearing structure 10 due to the relative rotation between the fixing assembly 20 and the bearing structure 10. However, since the fixed part 22 is abutted against the first magnetic member on the case, the descending of the fixing assembly 20 relative to the bearing structure 10 is specifically embodied as follows: the fixing assembly 20 is abutted against and rotated relative to the first magnetic member, while the bearing structure 10 is lifted relative to the case, so that the position A on the display surface of the display substrate is lifted until the distance from the position A to the bearing surface is consistent with the distance from any other position to the bearing surface. For another example, when a plurality of display substrates are spliced, it is detected whether display surfaces of the display substrates are in the same reference plane, and when the display surfaces of one or more display substrates are not in the same reference plane as the display surfaces of other display substrates, the above method can also be used to adjust a distance from any position on the one or more display surfaces to the reference plane, until the display surfaces of all display substrates are in the same plane.

When the fixing assembly 20 is controlled to rotate, an external magnetic device may be used to apply a force to the magnetic member 21. For example, ends of the magnetic device and the magnetic member 21 close to each other repel each other to apply a force toward the case to the magnetic member 21, while the magnetic device is controlled to rotate to drive the fixing assembly 20 to rotate synchronously.

Figure 6:
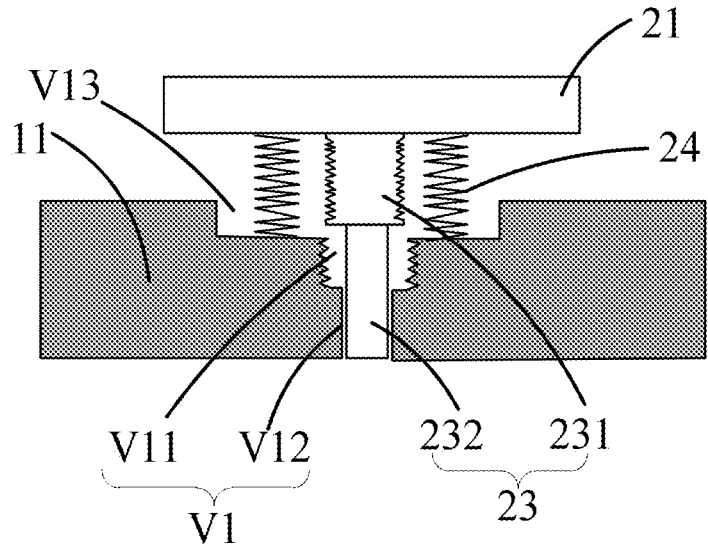
FIG. 6 is a schematic view of a connection member according to some embodiments of the present disclosure in a mounting hole.

FIG. 6 is a schematic view of a connection member according to some embodiments of the present disclosure in a mounting hole. In some embodiments, as shown in FIG. 5, a surface of second rod part 232 is smooth, i.e., the surface of the second rod portion 232 is not provided with thread. Accordingly, as shown in FIG. 6, the mounting hole V1 includes a first mounting sub-hole V11 and a second mounting sub-hole V12 coaxially arranged and communicated with each other. The first mounting sub-hole V11 is located on a side of the second mounting sub-hole V12 away from the fixed part 22, and the first mounting sub-hole V11 is provided with internal threads, while the second mounting sub-hole V12 has a smooth inner surface, so that the fixing assembly 20 can be lifted along the mounting hole V1 during the alignment of the bearing structure 10 and the case.

The first mounting sub-hole V11 has a larger bore diameter than the second mounting sub-hole V12, and the first rod part 231 has a larger diameter than the second rod part 232, so that the stability of the fixing assembly 20 during rise and fall is improved, and the fixing assembly 20 is prevented from swaying in the mounting hole V1. For example, the second mounting sub-hole V12 may have a bore diameter substantially the same as the diameter of the second rod part 232.

In some embodiments, the first mounting sub-hole V11 has a bore diameter between 1.8 mm and 3.2 mm, and the second mounting sub-hole V12 has a bore diameter between 1 mm and 2.4 mm. In some examples, the first mounting sub-hole V11 has a bore diameter of 1.8 mm or 2 mm or 2.5 mm or 3 mm, and the bore diameter of the second mounting sub-hole V12 may differ from the bore diameter of the first mounting sub-hole V11 by 0.8 mm or 0.7 mm or 0.9 mm. In some embodiments, different first mounting sub-holes V11 may have the same bore diameter or different bore diameters. For example, some first mounting sub-holes V11 have a bore diameter of 2 mm, and other first mounting sub-holes V11 have a bore diameter of 3 mm.

In some embodiments, as shown in FIG. 5, the connection member 23 may further include a third rod part 233 provided with threads, and the fixed part 22 is threadedly connected to the third rod part 233.

In one example, the fixed part 22 may include an iron block which may be directly connected to the third rod part 233. Alternatively, the fixed part 22 further includes a fixing seat on which the iron block is disposed, and the fixing seat is connected to the third rod part 233. In another example, the fixed part 22 may include a magnet that is magnetically opposite to the first magnetic member on the case, thereby implementing attraction. The magnet may be directly connected to the third rod part 233, or may be disposed on the fixing seat which is further connected to the third rod part 233.

In some embodiments, as shown in FIGS. 2 to 4, the assembly member may further include: a first elastic member 24. The first elastic member 24 has one end abutted against the second magnetic member 21, and the other end relatively fixed to the bottom plate 11 of the bearing structure 10. For example, the first elastic member 24 has one end in contact with the second magnetic member 21 and the other end in contact with the bottom plate 11 of the bearing structure 10, and under an elastic force of the first elastic member 24, the two ends are respectively abutted against the second magnetic member 21 and the bearing structure 10. Alternatively, two ends of the first elastic member 24 are respectively embedded in the second magnetic member 21 and the bottom plate 11 of the bearing structure 10. Apparently, two ends of the first elastic member 24 may be respectively connected to the second magnetic member 21 and the bottom plate 11 of the bearing structure 10 in other manners. In addition, as shown in FIG. 6, the bottom plate 11 may be further provided with a limit recess V13. The mounting hole V1 may be located at a bottom of the limit recess V13 and in communication with the limit recess V13. A part of the first elastic member 24 is located in the limit recess V13. The other end of the first elastic member 24 in contact with the bottom plate 11 of the bearing structure 10 as mentioned above may specifically means that the other end of the first elastic member 24 is in contact with a bottom plate of the limit recess V13. The first elastic member 24 may be a spring, and the limit recess V13 may have a caliber slightly greater than an outer diameter of the spring. By means of the limit recess V13, a limiting function to first elastic member 24 may be provided to prevent the first elastic member 24 from swaying during extension and retraction.

When neither of the external magnetic device and the first magnetic member on the case applies a magnetic force to the fixing assembly 20, the first elastic member 24 is in a compressed state, so that during alignment of the display substrate and the case, the first elastic member 24 provides an upward elastic force for the magnetic member 21, and the fixed part 22 is abutted against the bottom plate 11, thereby preventing the fixing assembly 20 from swaying. Moreover, when the assembly member is aligned with the case and the fixed part 22 is attracted with the first magnetic member, the elastic function of the first elastic member 24 can play a certain role in buffering, so as to avoid a significant instantaneous magnetic force between the fixed part 22 and the first magnetic member. In addition, in the present disclosure, a length of the first elastic member 24 in the compression limit state is less than a length of the first rod part 231, so that when the distance from a position on the display surface to the reference plane needs to be adjusted, the first rod part 231 can be ensured to be screwed into the first mounting sub-hole V11.

In one example, the first elastic member 24 may be a compression spring wound around the connection member 23. Apparently, the first elastic member 24 may adopt other structures, such as a spring leaf. The first elastic member 24 may be made of a non-magnetic metal material, such as aluminum, so as to facilitate reduction of the weight of the first elastic member 24 and avoid magnetic attraction with the second magnetic member 21.

In some embodiments, as shown in FIG. 4, the second magnetic member 21 includes one magnetic block 21*a*. In this condition, an extension line of an axis of the connection member 23 passes through the magnetic block 21*a*, to facilitate control of rotation of the fixing assembly 20 as a whole. For example, a central axis of the magnetic block 21*a* and the axis of the connection member 23 are located on the same straight line.

Figure 7:
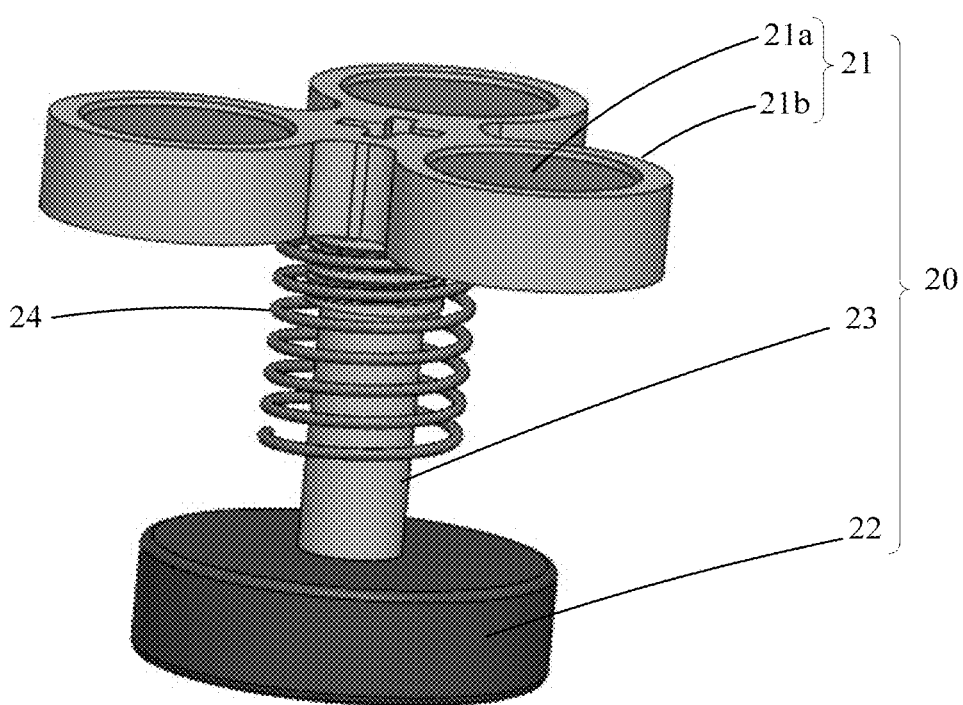
FIG. 7 is a schematic view of a fixing assembly and a first elastic member according to further embodiments of the present disclosure.
Figures 8, 9:
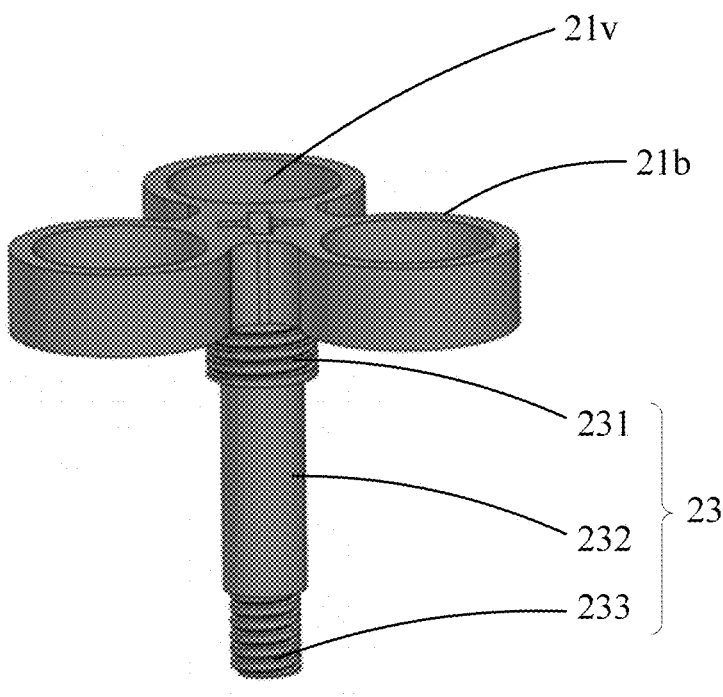

FIG. 7 is a schematic view of a fixing assembly and a first elastic member according to further embodiments of the present disclosure. FIG. 8 is a schematic view of a connection member and a mount in the fixing assembly of FIG. 7. Similar to the fixing assembly 20 shown in FIG. 4, the fixing assembly 20 in FIG. 7 also includes a second magnetic member 21, a connection member 23 and a fixed part 22. The second magnetic member 21 also includes a mount 21*b* and a magnetic block 21*a*. The only difference is that in FIG. 7, the second magnetic member 21 includes a plurality of magnetic blocks 21*a*, and the plurality of magnetic blocks 21*a* may have the same polarity. The mount 21*b* may be provided with a plurality of mounting recesses 21*v* into which the magnetic blocks 21*a* are disposed in one-to-one correspondence. For example, the number of the magnetic blocks 21*a* and the number of the mounting recesses 21*v* are both three, or four, or any other number. The plurality of magnetic blocks 21*a* may have the same size and shape, and the plurality of magnetic blocks 21*a* may be uniformly distributed around the extension line of the axis of the connection member 23, so that when an external magnetic device 30 is used to drive the fixing assembly 20 to rotate, the magnetic blocks 21*a* are subjected to substantially the same force, and thus the fixing assembly 20 can be rotated smoothly.

For the fixing assembly 20 shown in FIG. 7, when the external magnetic device 30 is used to drive the fixing assembly 20 to rotate, a greater rotational torque will lead to more convenient operation.

FIGS. 9 to 11 are schematic views illustrating an assembly process of an assembly member according to some embodiments of the present disclosure with a case. As shown in FIGS. 9 to 11, the display module includes a display substrate 40, and an assembly member including a bearing structure 10. A side wall 12 of the bearing structure 10 supports the display substrate 40, and the display substrate 40 is fixedly connected to the side wall 12. For example, the display substrate 40 may be bonded to a top surface 12*a* of the side wall 12. In the process shown in FIGS. 9 to 11, by applying a magnetic attractive force or repulsive force to the fixing assembly 20 by a magnetic device, the fixing assembly 20 can be moved relative to a bearing device in a thickness direction of the display substrate 40.

As shown in FIG. 9, before assembling, the fixing assembly 20 is attracted by an external magnetic device 30 (for example, as shown in FIG. 9, polarities of ends of the magnetic device 30 and the second magnetic member 21 close to each other are set to N pole and S pole, respectively) to drive the fixing assembly 20 to move toward the display substrate 40, so that the fixed part 22 approaches, and even contacts, the bottom plate 11. In the process, the ends of the magnetic device 30 and the second magnetic member 21 close to each other have opposite polarities, where one is N pole, and the other is S pole. The magnetic device 30 may include a suction disc and a magnetic member on the suction disc. The suction disc may perform vacuum adsorption on the display substrate 40 and the assembly member which are fixed together, while the magnetic member on the suction disc may perform magnetic attraction on the fixing assembly 20. After the fixing assembly 20 is moved toward the display substrate 40, the bearing structure 10 and the case 50 are aligned, such that the fixed part 22 of the fixing assembly 20 is directly opposite to the first magnetic member on the case. Thereafter, as shown in FIG. 10, the external magnetic device 30 is removed, and the side wall 12 of the bearing structure 10 is lapped with a side wall 52 of the case 50, thereby completing the initial assembly. In this case, the fixing assembly 20 moves toward a first magnetic member 51 under an action of the magnetic force between the fixed part 22 and the first magnetic member 51, until a bottom end of the first rod part 231 of the connection member 23 is abutted against a top of the first mounting sub-hole V11. At this time, the fixed part 22 and the first magnetic member 51 may contact each other, or there may be a small gap (e.g., a gap of 0.3 mm to 0.5 mm) therebetween. When the initial assembly is completed, it is detected whether a surface of the display substrate 40 away from the case 50 is flat. If there is unevenness at any position of the surface of the display substrate 40 away from the case 50, at least one fixing assembly 20 is adjusted. Specifically, when a position to be adjusted on the surface of the display substrate 40 away from the case is lower than other positions, as shown in FIG. 11, the magnetic device 30 is arranged opposite to the fixing assembly 20 at said position to be adjusted, and rotated. In the process, the ends of the magnetic device 30 and the second magnetic member 21 close to each other are provided with the same polarity (for example, both are S poles) and thus repel each other, making the fixing assembly 20 rotate synchronously with the magnetic device 30 while moving toward the first magnetic member 51. In other words, the fixing assembly 20 descends relative to the bearing structure 10. When the fixed part 22 is abutted against the first magnetic member 51, further rotation of the fixing assembly 20 will make the fixing assembly 20 further descend relative to the bearing structure 10. At this time, the fixed part 22 is abutted against the first magnetic member 20, so that the descending of the fixing assembly 20 relative to the bearing structure 10 is specifically embodied as follows: the fixing assembly 20 remains fixed relative to the first magnetic member 51, while the bearing structure 10 is lifted relative to the first magnetic member 51, thereby raising the position to be adjusted.

It should be noted that the above assembling process is illustrated by taking the fixing assembly 20 having the structure shown in FIG. 4 as an example. When the fixing assembly 20 adopts the structure shown in FIG. 7, the same assembling process is implemented and thus is not repeated here. When the assembly member is to be disassembled from the case 50, a reverse operation of the assembly process is performed. That is, the reverse operation includes: driving the fixing assembly 20 by the magnetic device 30 to rotate away from the first magnetic member 51; and then removing the assembly member from the case 50. This disassembly process is simple and convenient, and easy to operate. When the assembly member is separated from the case 50, under the elastic force of the elastic member 23, the second magnetic member 21 is moved away from the bottom plate 11 of the bearing structure 10, while the fixed part 22 is moved toward the bottom plate 11 until abutted against the bottom plate 11. With provision of the elastic member 23, the fixing assembly 20 can be kept in a steady state when the assembly member is separated from the case 50. The "steady state" here means that the fixing assembly 20 does not sway in the mounting hole V1.

Figure 13:
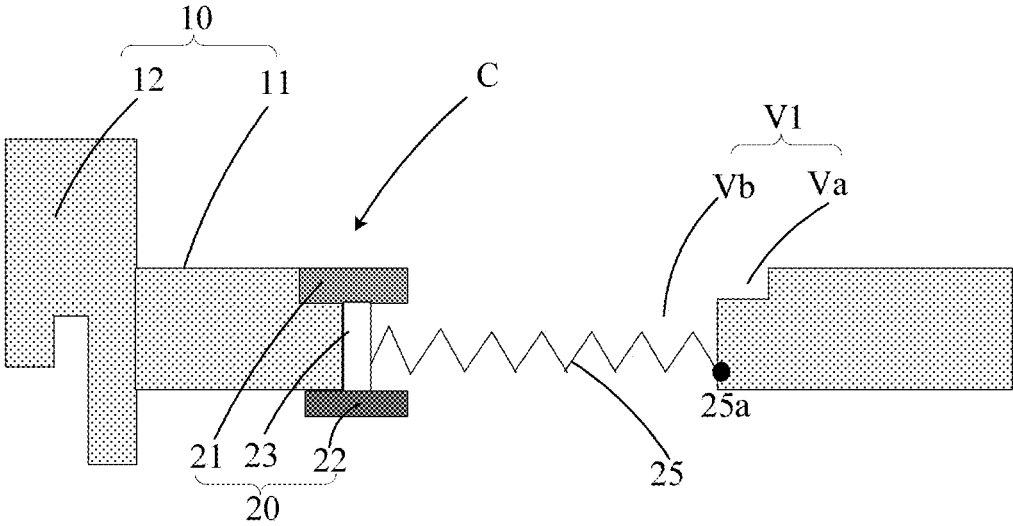
FIG. 13 is a partial sectional view of an assembly member according to further embodiments of the present disclosure.

FIG. 12 is a partial cutaway view of an assembly member according to further embodiments of the present disclosure. FIG. 13 is a partial sectional view of an assembly member according to further embodiments of the present disclosure. As shown in FIGS. 12 to 13, the assembly member includes a bearing structure 10 and a fixing assembly 20. Similar to the assembly member in FIG. 2, the bearing structure 10 of the assembly member in FIG. 12 includes a bottom plate 11 and a side wall 12, and a mounting hole V1 is provided in the bottom plate 11. The fixing assembly 20 includes a second magnetic member 21, a connection member 23 and a fixed part 22. In addition, similar to the fixing assembly 20 in FIG. 2, in FIG. 12, the second magnetic member 21 includes a mount 21b and a magnetic block 21a on the mount 21b. The mount 21b is connected to the connection member 23. For example, the connection member 23 and the mount 21b are integrally formed, or the connection member 23 is threadedly connected to the mount 21b. The fixed part 22 is an iron block which may be threadedly connected to the connection member 23. The differences between the assembly members in FIG. 12 and in FIG. 2 will be explained below.

In FIGS. 12 and 13, the mounting hole V1 in the bottom plate 11 is a strip-shaped hole, and the connection member 23 is configured to be slidable along a length direction of the strip-shaped hole. It should be noted that the strip-shaped hole means that a size of an opening of the hole in a certain direction is larger than a size of the opening in other directions. For example, the opening of the hole is rectangular, a slide rail type, or the like.

When mounting hole V1 is a strip-shaped hole, in the alignment process of the assembly member and the case 50, an external magnetic device 30 may be used to attract the fixing assembly 20 and make the fixing assembly 20 move along the strip-shaped hole. Therefore, in the alignment process, the fixed part 22 is offset from the first magnetic member 51 on the case 50, thereby reducing the magnetic force between the fixed part 22 and the first magnetic member 51, so as to avoid collisions of the display module due to a relatively large magnetic force in the alignment process. When the alignment is completed, the magnetic device 30 is further used to attract the fixing assembly 20 and to make the fixed part 22 of the fixing assembly 20 directly opposite to and attracted with the first magnetic member 51, thereby completing the assembly.

As shown in FIGS. 12 and 13, the strip-shaped hole is provided with a second elastic member 25 having a first end 25a connected to the bottom plate 11 and a second end connected to the connection member 23. The second elastic member 25 is configured to be stretchable along a length direction of the strip-shaped hole. In one example, the position of the mounting hole V1 in the bottom plate 11 and the elastic force of the second elastic member 25 satisfy the following conditions: when the side wall 12 of the bearing structure 10 is supported on the side wall 52 of the case 50 and no external magnetic device applies any force to the fixing assembly 20, the fixing assembly 20 is pressed by the second elastic member 25 at a position where the mounting hole V1 is away from the first end 25a of the second elastic member 25 (i.e. the position C of the mounting hole V1 in FIGS. 12 and 13), and the fixing assembly 20 can be directly opposite to the first magnetic member 51 on the case 50 to be attracted with the first magnetic member 51 on the case 50.

The second elastic member 25 may be a compression spring. Apparently, the second elastic member 25 may be any other elastic member, such as a spring leaf. The first end 25a of the second elastic member 25 may be embedded into the bottom plate 11, and the second end may be embedded into the connection member 23, thereby stably connecting with the bottom plate and the connection member 23. Apparently, the second elastic member 25 may also be connected to the bottom plate 11 and the connection member 23 in other manners.

In some embodiments, the mounting hole V1 includes: a first guide sub-hole Va and a second guide sub-hole Vb communicated with each other. At least part of the second magnetic member 21 is located in the first guide sub-hole Va. For example, a depth of the first guide sub-hole may be the same or substantially the same as a thickness of the second magnetic member 21, so that the entire second magnetic member 21 can be placed into the first guide sub-hole Va. At least part of the connection member 23 is located in the second guide sub-hole Vb. In this case, during the movement of the fixing assembly 20, the first guide sub-hole Va guides the second magnetic member 21, and the second guide sub-hole Vb guides the connection member 23, thereby improving stability of the fixing assembly 20 during movement.

In FIGS. 12 and 13, a distance between the second magnetic member 21 and the fixed part 22 of the fixing assembly 20 may be the same or substantially the same as a depth of the second guide sub-hole Vb, thereby preventing the fixing assembly 20 from swaying during movement.

In the fixing assembly 20 shown in FIGS. 12 and 13, the fixing assembly 20 is configured to extend along a length direction of the mounting hole V1 without being rotated. Therefore, threads in the mounting hole V1 and on the connection member 23 can be omitted.

Figure 14:
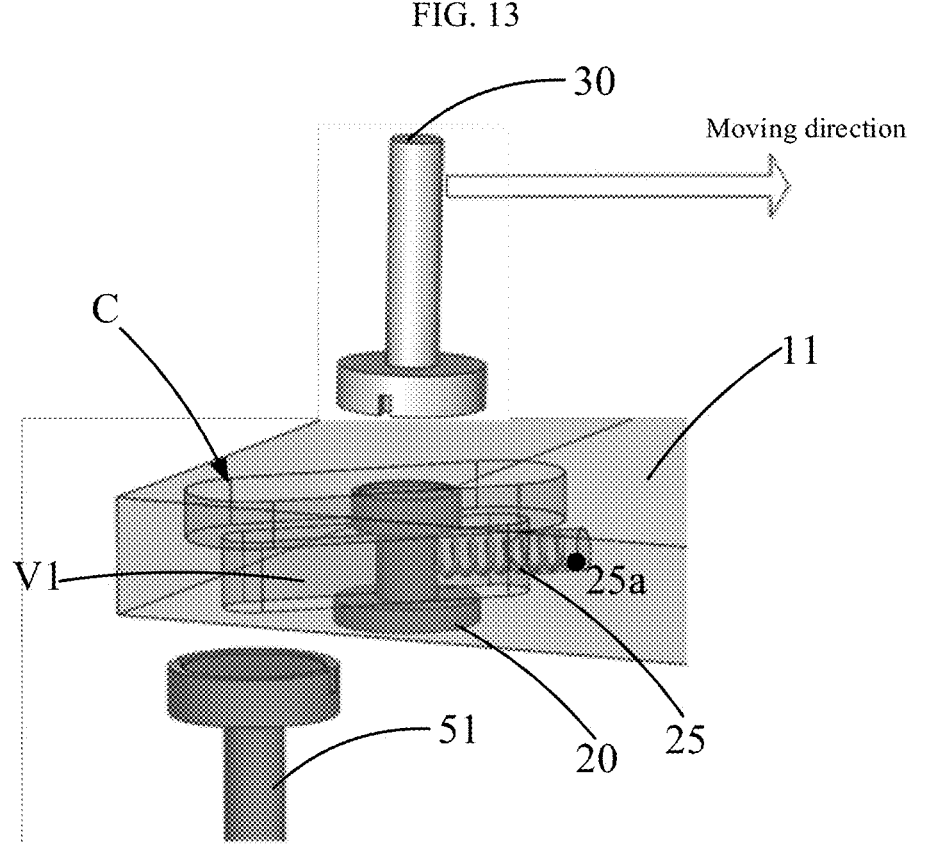
FIGS. 14 to 16 are schematic views illustrating an assembly process of an assembly member according to further embodiments of the present disclosure with a case.
Figure 15:
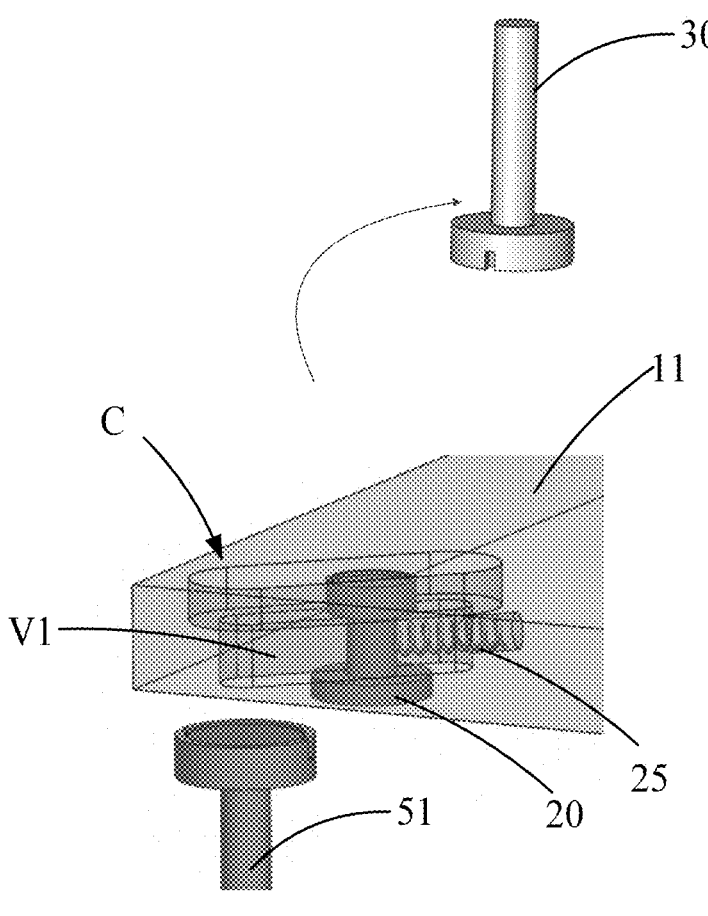
Figure 16:
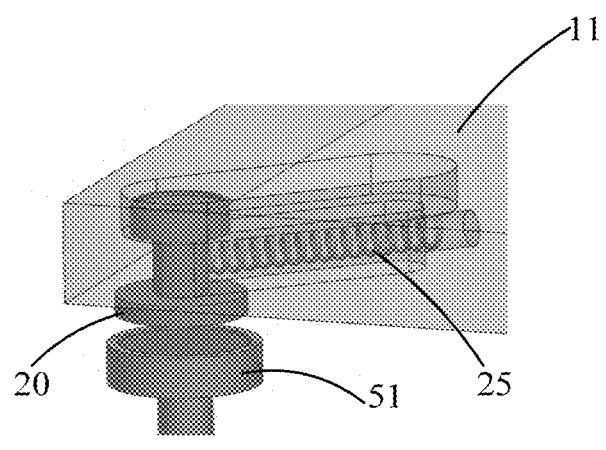

FIGS. 14 to 16 are schematic views illustrating an assembly process of an assembly member according to further embodiments of the present disclosure with a case. It should be noted that FIGS. 14 to 16 merely schematically illustrate the assembly process of the assembly member and the case, and the display substrate is not shown. In the process shown in FIGS. 14 to 16, an external magnetic device 30 may be used to drive the fixing assembly 20 to move relative to the bearing structure 10 in a direction parallel to the display surface of the display substrate 40. Before assembly, as shown in FIG. 14, the external magnetic device 30 is further used to attract the fixing assembly 20 and to drive the fixing assembly 20 pressing the second elastic member 25. Thereafter, the bearing structure 10 and the case 50 are aligned such that a position of the mounting hole V1 away from the first end 25a of the second elastic member 25 (i.e., the position C) is directly opposite to the first magnetic member 51 on the case 50, and the side wall 12 of the bearing structure 10 is supported on the side wall of the case 50, thereby completing the alignment. Thereafter, as shown in FIG. 15, the external magnetic device 30 is removed, and then, under the elastic force of the second elastic member 25, the fixing assembly 20 is pushed to the position C, and then, the fixing assembly 20 is located above the first magnetic member 51 (as shown in FIG. 16), so as to magnetically attract the fixing assembly 20 with the first magnetic member 51, thereby completing the assembly.

Figure 17A:
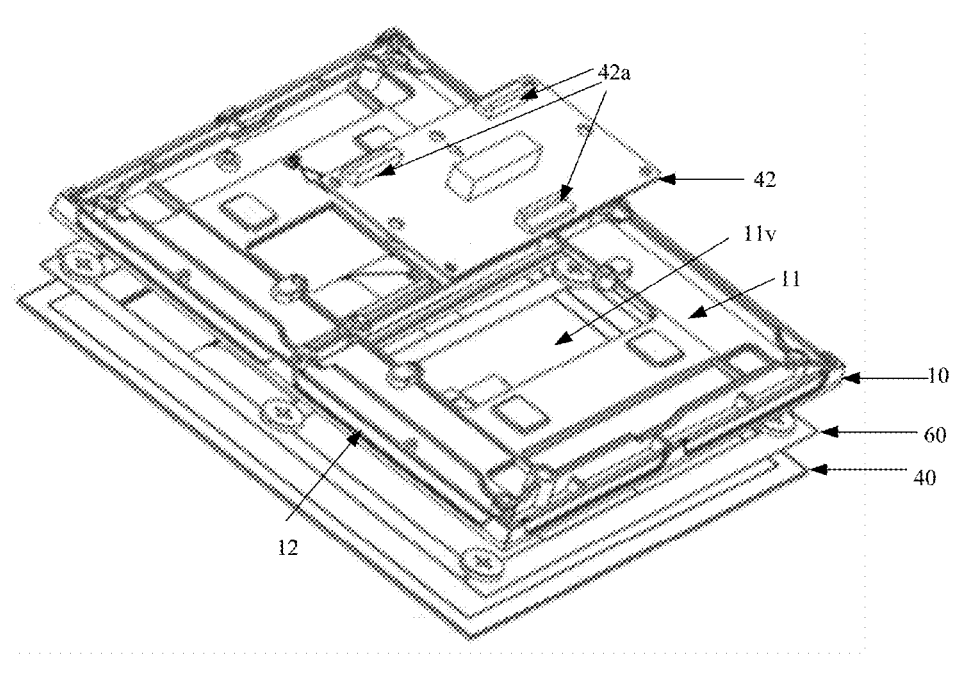
FIG. 17A is a partial exploded view of a display module according to some embodiments of the present disclosure.
Figure 17B:
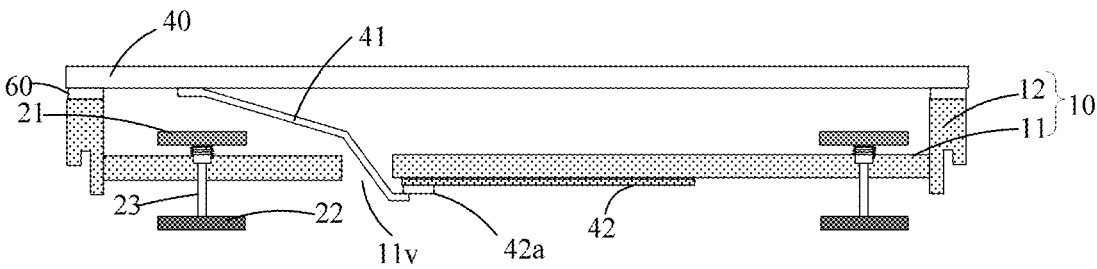
FIG. 17B is a partial cutaway view of a display module according to some embodiments of the present disclosure.
Figure 17C:
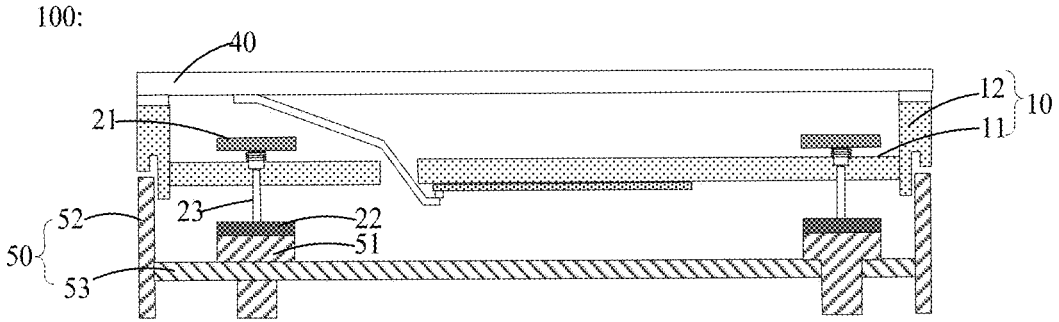
FIG. 17C is an overall cutaway view of a display module according to some embodiments of the present disclosure.

FIG. 17A is a partial exploded view of a display module according to some embodiments of the present disclosure. FIG. 17B is a partial cutaway view of a display module according to some embodiments of the present disclosure. FIG. 17C is an overall cutaway view of a display module according to some embodiments of the present disclosure. As shown in FIGS. 17A to 17C, the display module 100 includes a display substrate 40, the assembly member of the above embodiments, and a case 50 (not shown in FIGS. 17A and 17B). The display substrate 40 is supported on a side wall 12 of a bearing structure 10.

Figure 18:
FIG. 18 is a schematic view of a display substrate according to some embodiments of the present disclosure.

FIG. 18 is a schematic view of a display substrate according to some embodiments of the present disclosure. As shown in FIG. 18, the display substrate 40 includes: a base substrate 40a, and a light-emitting device 40b on the base substrate 40a. The light-emitting device 40b may be a micro light-emitting diode or the like.

In addition, as shown in FIGS. 17A and 17B, the display module may further include: a signal adapter board 42 and a flexible circuit board 41. A bottom plate 11 of the bearing structure 10 has a bearing surface facing the display substrate 40, and a mounting surface facing away from the display substrate 40. The bearing surface is configured to fix the display substrate 40. The signal adapter board 42 is disposed on the mounting surface. One end of the signal adapter board 42 is connected to a power line or a circuit board on the case, and the other end of the signal adapter board 42 is electrically connected to the display substrate 40 through the flexible circuit board 41. Electrical signals (e.g., voltage signals provided by the power line, or data signals provided by the circuit board) are written to the display substrate 40 via the signal adapter board 42. A hollowed-out portion 11v is provided on the bottom plate 11 of the bearing structure 10. One part of the flexible circuit board 41 is electrically connected to the display substrate 40, and the other part of the flexible circuit board passes through the hollowed-out portion 11v and is electrically connected to the signal adapter board 42.

The flexible circuit board 41 electrically connected to the display substrate 40 means that the flexible circuit board 41 is electrically connected to the light-emitting device. Specifically, the base substrate is provided with a first binding electrode and a second binding electrode. The first binding electrode is located on a side of the base substrate facing away from the light-emitting device, and the second binding electrode and the light-emitting device are located on the same side of the base substrate. The first binding electrode is connected to the light-emitting device via a signal line, and the second binding electrode is connected to the first binding electrode via a connection line. A binding area at one end of the flexible circuit board 41 is connected to the first binding electrode, and the other end of the flexible circuit board 41 is connected to a connector 42a on the signal adapter board 42. A part of the connection line may be located on a side of base substrate, in which case, when a plurality of display substrates are spliced for display, a splicing seam between adjacent display substrates has a relatively small width.

In addition, a plurality of, for example three, flexible circuit boards 41 may be provided. The three flexible circuit boards 41 are configure to transmit a first voltage signal, a second voltage signal, or a data signal to each light-emitting device. When a plurality of flexible circuit boards 41 are provided, hollowed-out portions 11v may be provided in one-to-one correspondence with the flexible circuit boards 41.

The display module may further include: a light-shielding sheet on a side of the base substrate facing away from the light-emitting device. With provision of the light-shielding sheet, the display effect can be prevented from being influenced by a structure on a backlight side of the display substrate 40.

The light-shielding sheet may have a shape substantially the same as the base substrate. The light-shielding sheet may be bonded onto the base substrate. For example, an edge of the light-shielding sheet is substantially flush with an edge of the base substrate, and an adhesive 60 is in contact with the assembly member and the light-shielding sheet, respectively, thereby fixing the display substrate 40 and the light-shielding sheet together with the assembly member. Alternatively, an edge of the light-shielding sheet is located inside an edge of the base substrate, and the adhesive 60 is in contact with the assembly member and the base substrate of the display substrate 40, respectively. The light-shielding sheet may cover the first binding electrode on the base substrate. In this case, the light-shielding sheet may be further provided with through holes in one-to-one correspondence with the flexible circuit boards 41, and the flexible circuit boards 41 pass through the through holes, so as to ensure that one end of each flexible circuit board 41 is connected to the first binding electrode, and the other end of each flexible circuit board 41 is connected to the signal adapter board 42.

Optionally, the light-shielding sheet may be made of graphite. Since graphite has good thermal conductivity, the light-shielding sheet playing a role of shielding light, while the light-shielding sheet may uniformly disperse heat generated by the display substrate 40, thereby preventing local overheat on the display substrate 40 and improving reliability of the display substrate 40.

As shown in FIG. 17C, the display module 100 further includes a case 50. The case 50 includes a side wall 52 and a top wall 53 connected to the side wall 52. A top end of the side wall 52 may protrude beyond the top wall 53, and the side wall 52 of the case 50 is configured to support a side wall 12 of the bearing structure 10. The top wall 53 is provided with a first magnetic member 51. The first magnetic member 51 may be connected to the top wall 53 by threaded connection or in other manners. The fixed part 22 of the fixing assembly 20 is magnetically attracted with the first magnetic member 51.

Figure 19:
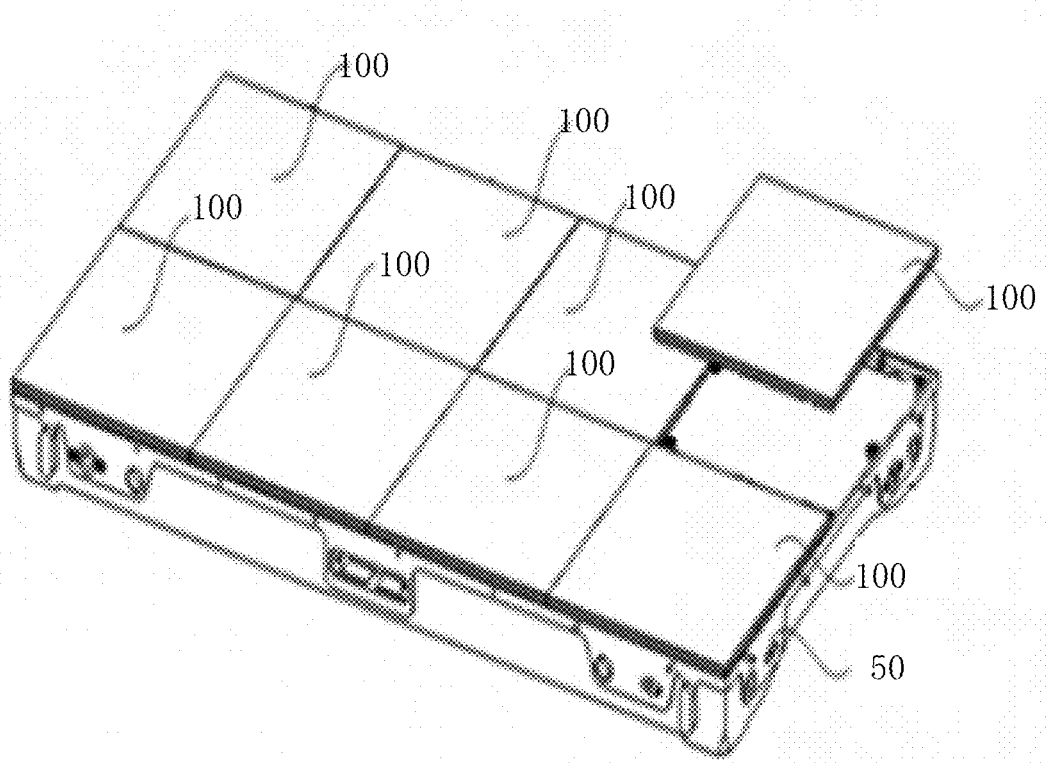
FIG. 19 is a perspective view of a splicing display apparatus according to some embodiments of the present disclosure.
Figure 20:
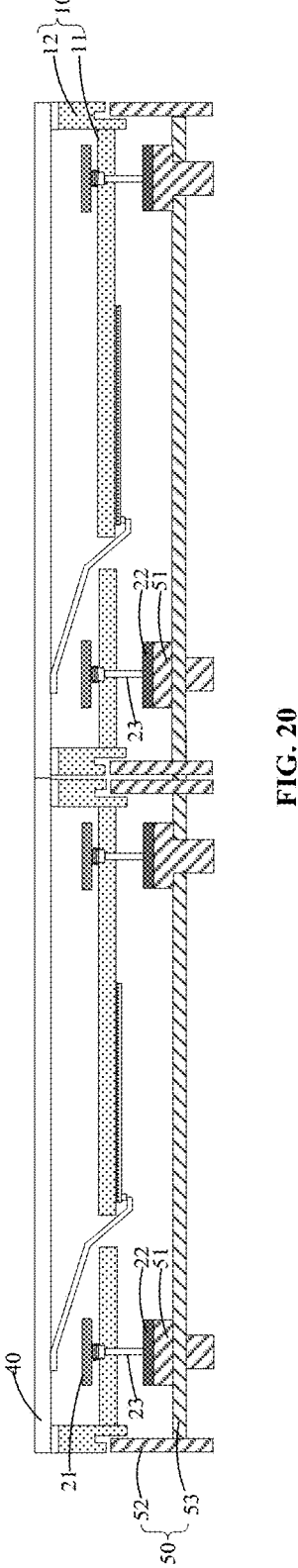
FIG. 20 is a cutaway view of a splicing display apparatus according to some embodiments of the present disclosure.

An embodiment of the present disclosure further provides a splicing display apparatus. FIG. 19 is a perspective view of a splicing display apparatus according to some embodiments of the present disclosure. FIG. 20 is a schematic diagram of a splicing display apparatus according to some embodiments of the present disclosure. FIG. 20 is a cutaway view of a splicing display apparatus according to some embodiments of the present disclosure. As shown in FIG. 20, the splicing display apparatus includes a display module 100 as described above. In the splicing display apparatus, a plurality of display substrates 40 are provided and spliced with each other. For example, the number of the display substrates 40 is two, and the two display substrates 40 are provided as adjacent. For another example, the number of the display substrates 40 is more than two, and the display substrates 40 are arranged in multiple rows and columns.

In the splicing display apparatus, one or more cases 50 may be provided. For example, one case 50 is provided, which has a plurality of assembly members each configured to bear one or more display substrates 40. For another example, one case 50 is provided, which has one assembly member than can bear a plurality of display substrates 40. For yet another example, a plurality of cases 50 are provided, each case 50 having one or more assembly members each configured to bear one or more display substrates 40.

The above describes the assembly member of a display module, the display module, and the splicing display apparatus provided in the embodiments of the present disclosure, from which it can be seen that in the embodiments of the present disclosure, a fixing assembly 20 is provided on a bearing structure 10 of the assembly member. The fixing assembly 20 passes through a bottom plate 11 of the bearing structure 10, and the fixing assembly 20 is movable relative to the bearing structure 10 in a thickness direction of the bottom plate or in a direction parallel to the bottom plate. In this manner, to assemble the assembly member with the case 50, the assembly member may be firstly aligned with the case 50. During the alignment process, an external magnetic device 30 is used to attract a second magnetic member 21 of the fixing assembly 20, and drive the magnetic assembly to move away from the first magnetic member 51, thereby reducing the magnetic force between the first magnetic member 51 and the fixed part 22, and avoiding collisions of the display substrate due to an instantaneous magnetic force in the alignment process. When the alignment is completed, a distance between the fixed part 22 and the first magnetic member 51 is reduced so that the fixed part 22 and the first magnetic member 51 are attracted with each other. Moreover, when the fixing assembly 20 adopts the structure shown in FIG. 4, the fixing assembly 20 may be rotated to make a display surface of the display substrate parallel to a reference plane, which is simple to operate and easy to maintain. In addition, the fixing assembly 20 has a simple structure, and will not increase the thickness of the display module.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. An assembly member of a display module, the assembly member is configured to be assembled with a case, the case comprises a first magnetic member, wherein the assembly member comprises:
   a bearing structure configured to bear at least one display substrate; and
   a fixing assembly disposed on the bearing structure and configured to be movable relative to the bearing structure; and the fixing assembly comprises: a second magnetic member and a fixed part fixedly connected to the second magnetic member, wherein the fixed part is located on a side of the second magnetic member close to the first magnetic member, and the fixed part is configured to be magnetically attracted with the first magnetic member.

2. The assembly member according to claim 1, wherein the bearing structure comprises a bottom plate and a side wall, wherein the side wall comprises a top surface and a side surface connected with each other, the top surface is configured to bear the display substrate, and the side surface is connected to the bottom plate, and a mounting hole is provided in the bottom plate; and
   the fixing assembly further comprises: a connection member with two ends connected to the second magnetic member and the fixed part, respectively, wherein the connection member passes through the mounting hole, and the connection member is configured to be movable in a direction parallel or perpendicular to the bottom plate.

3. The assembly member according to claim 2, wherein the connection member comprises: a first rod part and a second rod part connected with each other, the second magnetic member is connected to the first rod part, the first rod part is provided with external threads, and the mounting hole is provided with internal threads matched with the external threads.

4. The assembly member according to claim 3, wherein the assembly member further comprises: a first elastic member having one end abutted against the second magnetic member, and the other end relatively fixed to the bottom plate; and wherein a length of the first elastic member in a compression limit state is smaller than a length of the first rod part.

5. The assembly member according to claim 4, wherein the first elastic member comprises a compression spring wound around the connection member.

6. The assembly member according to claim 3, wherein the mounting hole comprises a first mounting sub-hole and a second mounting sub-hole coaxially arranged and communicated with each other, the first mounting sub-hole is located on a side of the second mounting sub-hole away from the fixed part, the internal threads are provided in the first mounting sub-hole, and an inner surface of the second mounting sub-hole and a surface of the second rod part are smooth surfaces.

7. The assembly member according to claim 6, wherein the first mounting sub-hole has a larger bore diameter than the second mounting sub-hole, and the first rod part has a larger diameter than the second rod part.

8. The assembly member according to claim 6, wherein the first mounting sub-hole has a bore diameter between 1.8 mm and 3.2 mm, and the second mounting sub-hole has a bore diameter between 1 mm and 2.4 mm.

9. The assembly member according to claim 2, wherein the second magnetic member comprises a mount and a magnetic block, the magnetic block is fixed on the mount, and the mount is connected to the connection member.

10. The assembly member according to claim 9, wherein the second magnetic member comprises one magnetic block through which an extension line of an axis of the connection member passes.

11. The assembly member according to claim 9, wherein the second magnetic member comprises a plurality of magnetic blocks uniformly distributed around an extension line of an axis of the connection member.

12. The assembly member according to claim 2, wherein the mounting hole is a strip-shaped hole, and the connection member is configured to be slidable along a length direction of the mounting hole.

13. The assembly member according to claim 12, wherein the strip-shaped hole is provided with a second elastic member having one end connected to the bottom plate and the other end connected to the connection member, and the second elastic member is configured to be stretchable along a length direction of the strip-shaped hole.

14. The assembly member according to claim 12, wherein the mounting hole comprises: a first guide sub-hole and a second guide sub-hole communicated with each other, at least part of the second magnetic member is located in the first guide sub-hole, and at least part of the connection member is located in the second guide sub-hole.

15. The assembly member according to claim 2, wherein the fixed part comprises an iron block.

16. The assembly member according to claim 2, wherein the fixed part is threadedly connected to the connection member.

17. The assembly member according to claim 1, wherein the fixing assembly is provided at least at a corner position of the bearing structure.

18. A display module, comprising: a display substrate, a case, and the assembly member according to claim 1, wherein a bearing structure in the assembly member is configured to bear the display substrate; and the case comprises a first magnetic member magnetically attracted with a fixed part of the fixing assembly.

19. A splicing display apparatus, comprising the display module of claim 18, wherein the splicing display apparatus comprises a plurality of display substrates spliced with each other.

* * * * *